United States Patent [19]
Yoshimura et al.

[11] Patent Number: 5,994,934
[45] Date of Patent: Nov. 30, 1999

[54] DELAY LOCKED LOOP CIRCUIT

[75] Inventors: Tsutomu Yoshimura; Yasunobu Nakase; Yoshikazu Morooka; Naoya Watanabe; Harufusa Kondoh; Hiromi Notani, all of Tokyo, Japan

[73] Assignee: Mitsubishi Denki Kabushiki Kaisha, Tokyo, Japan

[21] Appl. No.: 09/111,875

[22] Filed: Jul. 8, 1998

[30] Foreign Application Priority Data

Jan. 13, 1998 [JP] Japan .................................. 10-004979

[51] Int. Cl.[6] .................................................. H03L 7/06
[52] U.S. Cl. ........................................... 327/158; 327/156
[58] Field of Search .................................. 327/147, 148, 327/149, 150, 156, 157, 158, 159, 160, 142, 198; 375/371

[56] References Cited

U.S. PATENT DOCUMENTS

| | | | |
|---|---|---|---|
| 4,812,783 | 3/1989 | Honjo et al. ................................ | 331/20 |
| 5,347,232 | 9/1994 | Nishimichi .................................. | 331/1 |
| 5,554,945 | 9/1996 | Lee et al. .................................... | 327/105 |
| 5,896,066 | 4/1999 | Katayama et al. ......................... | 331/17 |

OTHER PUBLICATIONS

Thomas H. Lee, et al., "A 2.5V CMOS Delay–Locked Loop for an 18 Mbit, 500 Megabyte/s DRAM," IEEE Journal of Solid–State Circuits, vol. 29, No. 12, Dec. 1994, pp. 1491–1496.

*Primary Examiner*—Toan Tran
*Assistant Examiner*—Anh-Quan Tra
*Attorney, Agent, or Firm*—Burns, Doane, Swecker & Mathis, LLP

[57] ABSTRACT

Provided is a DLL circuit that can execute a precise delay synchronization operation without increasing the variable delay time range of a delay line. The DLL circuit comprises a phase comparator (3), a charge pump (6), an LPF (8) and a delay line (9), and operates to match phases of an input signal (CLKIN) and a feedback signal (FBCLK). The phase comparator (3) always outputs a phase comparison result that causes a delay time of the delay line (9) to increase, at the time of initial operation after a reset operation. The LPF (8) outputs a delay adjusting signal (S8) indicating that a delay time due to the delay line (9) becomes the minimum, in executing a reset.

13 Claims, 12 Drawing Sheets

DELAY LOCKED LOOP CIRCUIT

BACKGROUND OF THE INVENTION

1. Field of the Invention

The present invention relates to a delay locked loop (DLL) circuit in which comparison is made between the phase of an input signal and that of a signal obtained by causing the input signal to delay, and then a delay stage is adjusted so that their timings become equal.

2. Description of the Background Art

FIG. 15 is a diagram illustrating the configuration of a conventional DLL circuit. As shown in FIG. 15, a phase comparator (PFD) 23 compares the phase of an input signal CLKIN as a reference clock signal and the phase of a feedback signal FBCLK as a real use clock signal, to output an up signal UP and a down signal DWN to a charge pump (CP) 6. A feedback signal FBCLK is a signal which is obtained after an input signal CLKIN propagates a delay line 9 and an internal circuit 17, and therefore, a delay time occurs due to the propagation through the delay line 9 and the internal circuit 17. The internal circuit 17 is an internal circuit of clock processing system, e.g., clock trees.

The CP 6 supplies a current I6 to a low-pass filter (LPF) 28, based on an up signal UP and a down signal DWN, and drains it from the LPF 28. That is, the CP 6 supplies a current I6 when an up signal UP is "H" and drains a current I6 from the LPF 28 when a down signal DWN is "H".

The LPF 28 integrates a current I6 and, based on its result (a potential V1 of a node N1), outputs a delay adjusting signal S28 to the delay line 9. When an external reset signal RST is at "H" level, the LPF 28 outputs a delay adjusting signal S28 indicating that a delay time due to the delay line 9 is minimized, irrespective of a current I6.

The delay line 9 causes an input signal CLKIN to delay a delay time DT9 indicated by a delay adjusting signal S28, to output a delay input signal CLKOUT as a delay reference clock signal. A feedback signal FBCLK that is a signal obtained by causing a delay input signal CLKOUT outputted from the delay line 9 to delay in passing through the internal circuit 17, is used as a clock for controlling the timing of a data latch 18 or the like, and is also fed back to the phase comparator 23.

In this DLL circuit 10, a DLL comprises the phase comparator 23, the CP 6, the LPF 28 and the delay line 9, and a delay time DT9 of the delay line 9 is adjusted so that the phase of an input signal CLKIN matches that of a feedback signal FBCLK. It is therefore possible to latch data DATA in synchronization with the input signal CLKIN, based on a feedback signal FBCLK, regardless of a delay time due to the internal circuit 17.

FIG. 16 is a block diagram showing the internal configuration of a phase comparator 23. Such a comparator is for example disclosed in *Symposium on VLSI Circuits Digest of Technical Papers*, 94, pp.129–130. As shown in FIG. 16, phase comparison sections 20U, 20D output an up signal UP and a down signal DWN, respectively, based on the phase difference between a signal obtained from a clock input CLK and a signal obtained from a feedback input FB.

In the phase comparison section 20U the clock input CLK receives an input signal CLKIN, the feedback input FB receives a feedback signal FBCLK, and an inhibit input INHB receives a down signal DWN. In the phase comparison section 20D the clock input CLK receives a feedback signal FBCLK, the feedback input FB receives an input signal CLKIN, and an inhibit input INHB receives an up signal UP.

FIG. 17 is a circuit diagram showing the internal configuration of a phase comparison section 20U (20D). As shown in FIG. 17, an input of an inverter 41 is connected to a clock input CLK. PMOS transistor Q1 and NMOS transistors Q2, Q3 are interposed in series from a power supply to a ground level. The gates of PMOS transistor Q1 and the NMOS transistor Q3 are connected in common to an output of the inverter 41.

PMOS transistor Q4 and NMOS transistors Q5, Q6 are interposed in series from a power supply to a ground level. NMOS transistor Q7 is connected in parallel to the NMOS transistor Q5. The gates of the PMOS transistor Q4 and the NMOS transistor Q6 are connected in common to the drain of the PMOS transistor Q1 (the NMOS transistor Q2), the gate of the NMOS transistor Q5 is connected to a feedback input FB, and the gate of the NMOS transistor Q7 is connected to an inhibit input INHB.

In addition, PMOS transistor Q8 and NMOS transistors Q9, Q10 are interposed in series from a power supply to a ground level. The gates of the PMOS transistor Q8 and the NMOS transistor Q10 are connected in common to the drain of the PMOS transistor Q4 (the NMOS transistors Q5, Q7), the gate of the NMOS transistor Q9 is connected to the drain of the PMOS transistor Q1, the drain of the PMOS transistor Q8 (the NMOS transistor Q9) is connected to an input section of an inverter 42 and is also connected to the gate of the NMOS transistor Q2.

A signal obtained from an output of the inverter 42 becomes an up signal UP (a down signal DWN).

FIGS. 18 and 19 are a timing diagram illustrating a phase comparison operation of a phase comparator 23 with the configuration as shown in FIGS. 16 and 17. As shown in FIG. 18, when the phase of a feedback signal FBCLK is delayed than that of an input signal CLKIN, an up signal UP of a phase comparison section 20U becomes "H" for a period of time from the rise of the input signal CLKIN to the rise of the feedback signal FBCLK, while a down signal DWN of a phase comparison section 20D becomes "L" at all times.

As a result, the up signal UP and the down signal DWN of the phase comparator 23 cause the phase of the feedback signal FBCLK to advance, so that a delay time DT9 due to the delay line 9 is decreased by a CP 6 and an LPF 28.

Referring to FIG. 19, when the phase of a feedback signal FBCLK is advanced than an input signal CLKIN, a down signal DWN of a phase comparison section 20D becomes "H" during a period of time from the rise of feedback signal FBCLK to the rise of the input signal CLKIN, while an up signal UP of a phase comparison section 20U becomes "L" at all times.

As a result, the up signal UP and the down signal DWN of the phase comparator 23 causes the phase of the feedback signal FBCLK to delay, so that a delay time DT9 due to the delay line 9 is increased by the CP 6 and the LPF 28.

In the conventional DLL circuit, however, a wide variety of phase relations between an input signal CLKIN and a feedback signal FBCLK are determined by a delay time due to the internal circuit 17. Therefore, it is impossible for a phase comparator 23 to judge at the time of initial operation whether a phase should be advanced or delayed.

To obtain a variable delay time range sufficient for synchronization whatever phase relations are present between an input signal CLKIN and a feedback input FB (e.g., at least two times or more of a signal period T of an input signal CLKIN), the delay line 9 of the conventional DLL circuit is required to have a large number of delay stages. This causes an increase in the circuit scale and dissipation power of the DLL circuit.

Lock deviation phenomenon occurred when a delay time due to an internal circuit 17 fluctuates during operation is described by referring to FIG. 20. In conventional DLL circuits, in order to match the phase of an input signal CLKIN with that of a feedback signal FBCLK, the total delay time of a delay time DT17 due to an internal circuit 17 and a delay time DT9 due to a delay line 9 is always arranged to be integral multiples of a period T of an input signal CLKIN. For a narrow variable delay time range of the delay line 9, if the delay time DT17 due to the internal circuit 17 fluctuates gradually because of circumstances, e.g., temperature, it is outside the variable delay time range of the delay line 9 with respect to shifts of more than a certain value, making it impossible to match phases.

As shown in FIG. 20, suppose that the total delay time (DT17+DT9) of a delay time DT17 of the internal circuit 17 and a delay time DT9 of the delay line 9 is in synchronization with kT (k is a natural number) at time t0, but the delay time DT17 of the internal circuit 17 increases with the passage of time.

In this case, since the phase of a feedback signal FBCLK is delayed than that of an input signal CLKIN, a DLL circuit 10 operates to advance the phase, i.e., to decrease the delay time DT9 of the delay line 9. Until time t1, the total delay time, (DT17+DT9)=kT, is given by that an increase in the delay time DT17 is compensated by a decrease in the delay time DT9, thereby it is possible to synchronize the input signal CLKIN with the feedback signal FBCLK However, if the delay time DT17 is further increased after time t1, it is outside the variable delay time range of the delay line 9 (the region shown by diagonal in FIG. 20). That is, even when the delay time DT9 of the delay line 9 is set to be a minimum delay time ΔDT, it follows that (DT17+DT9)>kT. It is therefore impossible to synchronize the input signal CLKIN with the feedback signal FBCLK by advancing the phase of the feedback signal FBCLK This phenomenon is referred to as lock deviation phenomenon.

To solve lock deviation phenomenon, it is also necessary that the number of delay stages of a delay line 9 is large enough and a variable delay time range is increased considerably. This leads to a large scaled circuit configuration and an increased dissipation power, as stated earlier. Also, the resistance to noise of the delay line 9 may be affected with increasing the number of stages of the delay line 9.

SUMMARY OF THE INVENTION

According to a first aspect of the present invention, a delay locked loop (DLL) circuit for synchronizing phases of a reference clock signal and a real use clock signal, comprises: phase comparator for comparing phases of the reference clock signal and the real use clock signal, delay time control portion for outputting a delay control signal based on a phase comparison result of the phase comparator; and delay line having a variable delay time range from a first limiting delay time to a second limiting delay time, for causing the reference clock signal to delay a delay time indicated by the delay control signal, to output a delay reference clock signal, a signal obtained after the delay reference clock signal propagates a circuit outside the delay locked loop circuit being used as the real use clock signal, wherein the delay time control portion receives a reset signal and outputs the delay time control signal indicating the first limiting delay time when the reset signal is active; and wherein the phase comparator receives the reset signal and outputs the phase comparison result that forcedly indicates a delay time shift in a first direction from the first limiting delay time to the second limiting delay time, during a synchronization processing period which includes a period from a time when the reset signal changes from active to inactive to a time when the reference clock signal is in synchronization with the real use clock signal.

According to a second aspect of the present invention, in the DLL circuit of the first aspect, the phase comparison result of the phase comparator includes a first comparison result that indicates presence/absence of a delay time shift of the first direction by active/inactive state, and a second comparison result that indicates presence/absence of a delay time shift in a second direction opposite to the first direction by active/inactive state. The phase comparator includes: a first phase comparison section for outputting the first comparison result based on a phase difference between the reference clock signal and the real use clock signal; and a second phase comparison section for outputting the second comparison result based on a phase difference between the reference clock signal and the real use clock signal. The first phase comparison section also receives the second comparison result and, when it is active, forcedly changes the first comparison result to inactive state. The second phase comparison section also receives the first comparison result and, when it is active, forcedly changes the second comparison result to inactive state, and further receives the reset signal and, when it is active, forcedly changes the second comparison result to inactive state.

According to a third aspect of the present invention, the DLL circuit as defined in the foregoing aspects in characterized in that the reset signal contains an external reset signal that can be inputted from exterior.

According to a fourth aspect of the present invention, the DLL circuit of the first aspect wherein the reset signal contains an internal reset signal that is generated inside, the delay locked loop circuit further comprises a synchronization deviation judge circuit for monitoring a signal related to the phase comparison result to judge a presence of a synchronization deviation based on an extent to which the phase comparison result indicates a delay time shift in a predetermined direction, and then outputting the internal reset signal based on a result of judge. The synchronization deviation judge circuit changes the internal reset signal to active state for a predetermined period and then to inactive state, if judged the synchronization deviation is present.

According to a fifth aspect of the present invention, in the delay locked loop circuit of the fourth aspect, the delay time control portion includes: a charge pump for supplying a current from an output section, alternatively, drains a current into the output section, based on an indication of the phase comparison result; and a low-pass filter having a predetermined node connected to the output section of the charge pump, for outputting the delay time control signal based on a potential of the predetermined node obtained by low-pass filtering, wherein the signal related to the phase comparison result contains a potential of the predetermined node.

According to a sixth aspect of the present invention, the DLL circuit of the fourth aspect wherein the predetermined direction contains a second direction opposite to the first direction; and the synchronization deviation judge circuit further outputs a judge related signal based on the presence/absence of the synchronization deviation, the delay locked loop circuit further comprises a phase inversion portion for receiving the judge related signal to recognize a synchronization deviation time when it is judged the synchronization deviation is present, and then performing an inversion operation for inverting a phase of the delay reference clock signal by using the synchronization deviation time as a trigger.

According to a seventh aspect of the present invention, the DLL circuit as defined in the fourth aspect is characterized in that the synchronization deviation means also receives an external reset signal that can be inputted from exterior to forcedly change the internal reset signal to active state when the external reset signal is active.

According to an eighth aspect of the present invention, the DLL circuit as defined in the first aspect is characterized in that the first limiting delay time contains a minimum delay time within the variable delay time range, the second limiting delay time contains a maximum delay time within the variable delay time range, and the first direction contains a direction to increase a delay time.

According to a ninth aspect of the present invention, a DLL circuit for synchronizing phases of a reference clock signal and a real use clock signal, comprises: phase comparator for comparing phases of the reference clock signal and the real use clock signal; delay time control portion for outputting a delay control signal based on a phase comparison result of the phase comparator; delay line for causing the reference clock signal to delay a delay time indicated by the delay control signal to output a delay reference clock signal, a signal that is obtained after the delay reference clock signal propagates a circuit outside the DLL circuit being used as the real use clock signal. This DLL circuit further comprises synchronization deviation judge circuit for monitoring a signal related to the phase comparison result to judge a presence of a synchronization deviation based on an extent to which the phase comparison result indicates a delay time shift in a predetermined direction.

The DLL circuit of the first aspect comprises: delay time control portion that outputs a delay time control signal indicating a first limiting delay time when a reset signal is active; and phase comparator that outputs a phase comparison result that forcedly indicates a delay time shift in the first direction from the first limiting delay time to the second limiting delay time, in a synchronization processing period after a reset signal changes from active to inactive.

Therefore, at the time of initial operation in which a reset signal becomes inactive after being active for a proper time, the DLL circuit of the first aspect always performs a delay synchronization processing between a reference clock signal and a real use clock signal, while changing a delay time from the first limiting delay time to the first direction.

Since at the time of initial operation a variable delay time range may be set only by taking into consideration a delay time shift from the first limiting delay time to the first direction, a precise delay synchronization operation can be performed at the initial operation even when a variable delay time range is narrower than that of prior art. This provides DLL circuits whose circuit configuration and dissipation power are minimized.

In the second phase comparison section of the DLL circuit according to the second aspect, when a reset signal is active, the second comparison result that indicates the presence/absence of a delay time shift in the second direction opposite to the first direction by active/inactive state, is forced to be inactive.

Therefore, when a reset signal is active, an active period of the first comparison result that indicates the presence/absence of a delay time shift in the first direction by active/inactive state, is outputted preferentially. Even if after a proper time the reset signal changes from active to inactive, the second comparison result is forced to be inactive by the first comparison result that was preferentially outputted when the reset signal was active. As a result, during synchronization processing, the active period of the first comparison result is longer than that of the second comparison result.

Consequently, at the time of initial operation in which a reset signal becomes inactive after being active for a proper time, the phase comparator always outputs a phase comparison result (the first and second comparison result) for indicating a delay time shift in the first direction.

In the DLL circuit of the third aspect, since a reset signal contains an external reset signal that can be inputted from the exterior, an initial operation can be performed by using the external reset signal.

The synchronization deviation judge circuit on the DLL circuit of the fourth aspect monitors a signal related to a phase comparison result to judge the presence of a synchronization deviation depending on the extend to which the phase comparison result indicates a delay time shift in a predetermined direction. When judged a synchronization deviation is present, the synchronization deviation judge circuit outputs an internal reset signal that becomes inactive after being active for a predetermined time.

Therefore, whenever a synchronization deviation is present, it is possible to perform a delay synchronization processing between a reference clock signal and a real use clock signal by changing a delay time from the first limiting delay time in the first direction.

In the DLL circuit of the fifth aspect, since the potential of a predetermined node of the low-pass filter connected to the output section of the charge pump is employed as a signal related to the above-mentioned phase comparison result, it is possible to judge the presence of a synchronization deviation based on the result obtained after the comparator makes comparison between the potential of a predetermined node and a predetermined reference voltage.

In the phase inversion means on the DLL circuit of the sixth aspect, the presence of a synchronization deviation becomes the trigger of an inversion operation for inverting the phase of a delay reference clock signal. Therefore, the phase relation between a reference clock signal and a real use clock signal can be reversed with a phase difference of not more than half a reference clock signal period.

As a result, whenever a synchronization deviation is present, a prompt delay synchronization processing can be executed while changing a delay time from the first limiting delay time in the first direction that narrows the above-mentioned phase difference.

In the synchronization deviation judge circuit on the DLL circuit of the seventh aspect, an internal reset signal is forced to be active when an external reset signal is active, thereby enabling to execute an initial operation by using an external reset signal.

In the DLL circuit of the eighth aspect, the first limiting delay time contains the minimum delay time within a variable delay time range, the second limiting delay time contains the maximum delay time within a variable delay time range, and the first direction contains a direction to increase a delay time.

Therefore, at the time of initial operation in which a reset signal becomes inactive after being active for a proper time, a delay synchronization processing between a reference clock signal and a real use clock signal is always made while increasing a delay time from the minimum delay time.

By initializing a delay time of delay means to the minimum delay time, a delay synchronization processing can be performed in a state where the delay means has a great driving force for signal propagation. This minimizes the influence of jitter that is caused by a waveform rounding of a signal propagating the delay line.

The synchronization deviation means on the DLL circuit of the ninth aspect monitors a signal related to a phase comparison result to judge the presence of a synchronization deviation depending on the extent to which the phase comparison result indicates a delay time shift in a predetermined direction. Therefore, processing made when a synchronization deviation is present can be carried out automatically by executing the processing coupled with the result of the synchronization judge means.

Accordingly, it is an object of the present invention to provide a DLL circuit that can execute a precise delay synchronization operation without increasing a variable delay time range of a delay line, or a DLL circuit that can react to lock deviation phenomenon.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment
Overall Configuration

Figure 1:
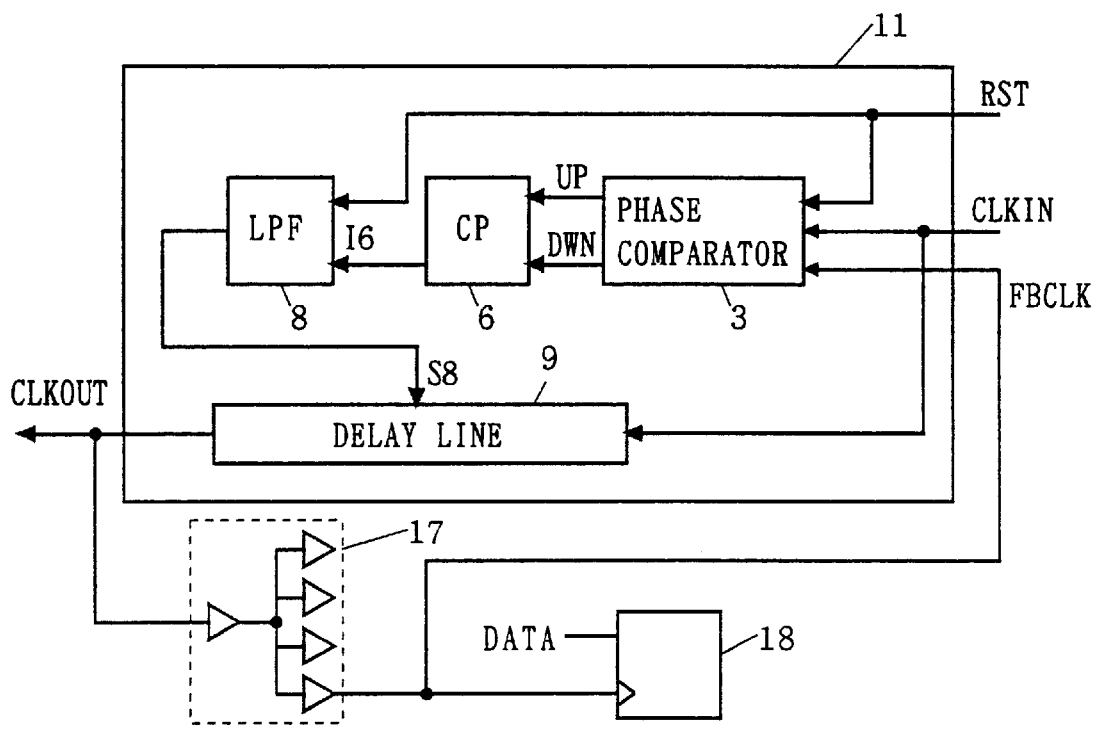
FIG. 1 is a diagram for explaining the configuration of a DLL circuit according to a first preferred embodiment of the present invention.

FIG. 1 is a diagram for explaining the configuration of a DLL circuit according to a first preferred embodiment of the present invention. As shown in FIG. 1, a phase comparator 3 compares, at the normal comparison operation, the phase of an input signal CLKIN as a reference clock signal with that of a feedback signal FBCLK as a real use clock signal, to output an up signal UP and a down signal DWN to a charge pump (CP) 6. A feedback signal FBCLK is a signal obtained after an input signal CLKIN propagates a delay line 9 and an internal circuit 17 of clock processing system, e.g., clock trees. A delay time occurs as a result of propagating through the delay line 9 and the internal circuit 17.

The phase comparator 3 performs the normal comparison operation/reset input comparison operation based on "L"/"H" of an external reset signal RST. The phase comparator 3 always causes a phase to delay during a reset input comparison operation, that is, outputs a phase comparison result (an up signal UP and a down signal DWN) that causes a delay time of the delay line 9 to increase. Also, during the normal comparison operation immediately after a reset input comparison operation, the phase comparator 3 is affected by the reset input comparison operation until an input signal CLKIN is in synchronization with a feedback signal FBCLK, to output a phase comparison result that causes a delay time of the delay line 9 to increase.

The CP 6 supplies a current I6 to an LPF 8 or drains it from the LPF 8, based on an up signal UP and a down signal DWN. That is, the CP 6 supplies a current I6 when an up signal UP is "H", and drains a current I6 from the LPF 8 when a down signal DWN is "H".

The LPF 8 integrates a current I6 and, based on its result, outputs a delay adjusting signal S8 to the delay line 9. When an external reset signal RST is at "H" level, the LPF 8 outputs a delay adjusting signal S8 that causes a delay time DT9 due to the delay line 9 to be minimized, irrespective of a current I6.

The delay line 9 causes an input signal CLKIN to delay a delay time DT9 indicated by a delay adjusting signal S8, to output a delay input signal CLKOUT as a delay reference clock signal. A feedback signal FBCLK that is obtained after a delay input signal CLKOUT outputted from the delay line 9 passes through the internal circuit 17, is used as a clock for controlling the timing of a data latch 18 or the like, and is also fed back to the phase comparator 3.

In the DLL circuit 11 of this preferred embodiment, a DLL comprises the phase comparator 3, the CP 6, the LPF 8 and the delay line 9, and acts to match the phases of an input signal CLKIN and a feedback signal FBCLK, as in prior art.

It should be noted that when an external reset signal RST is "H", the phase comparator 3 always outputs an up signal UP and a down signal DWN that causes a phase to delay, and the LPF 8 outputs to the delay line 9 a delay adjusting signal S8 indicting a minimum delay time ΔDT.

Therefore, by setting an external reset signal RST to "H" for a predetermined period and then to "L", at the time of initial operation, the DLL circuit 11 always performs a delay synchronization operation in such a direction as to increase a delay time DT9 of the delay line 9, after the delay time DT9 is initialized to a minimum delay time ΔDT.

Accordingly, in the DLL circuit 11 it is possible to set a narrow variable delay time range of the delay line 9 (approximately a signal period T of an input signal CLKIN) by setting a variable delay time range of the delay line 9 at the time of initial operation, without taking into consideration the case where a delay synchronization is made by decreasing a delay time ΔDT.

As described, the DLL circuit 11 of this embodiment can execute a precise delay synchronization operation at the time of initial operation even if the number of stages of the delay line 9 is reduced than that of conventional ones This provides a DLL circuit whose circuit configuration and dissipation power are minimized.

Phase Comparator

Figure 2:
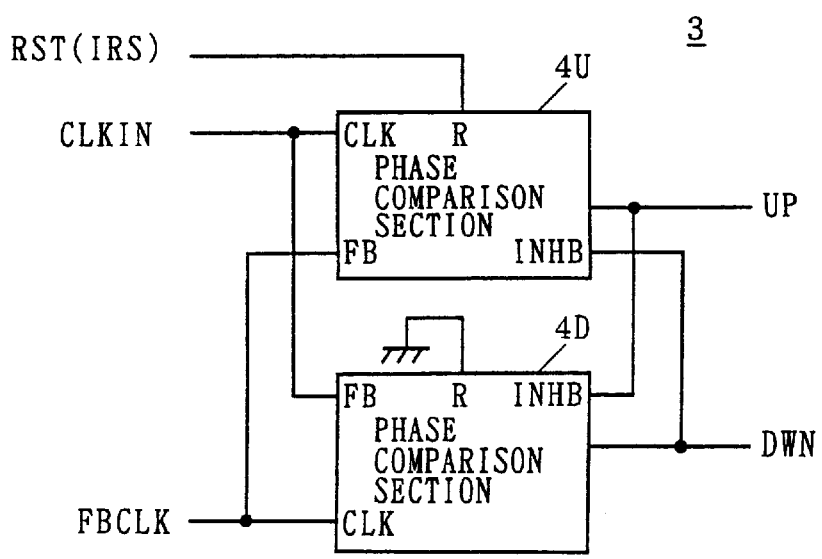
FIG. 2 is a circuit diagram showing the configuration of a phase comparator according to the first preferred embodiment.

FIG. 2 is a block diagram showing the internal configuration of a phase comparator 3. As shown in FIG. 2, phase comparison sections 4U, 4D output an up signal UP and a down signal DWN, respectively, based on the phase difference between a signal obtained from a clock input CLK and a signal obtained from a feedback input FB.

In the phase comparison section 4U the clock input CLK receives an input signal CLKIN, the feedback input FB receives a feedback signal FBCLK, and an inhibit input INHB receives a down signal DWN. The phase comparison section 4U also has a reset input R for receiving an external reset signal RST.

In the phase comparison section 4D the clock input CLK receives a feedback signal FBCLK, the feedback input FB receives an input signal CLKIN, and an inhibit input INHB receives an up signal UP. The phase comparison section 4D also has a reset input R which is fixed to a ground level.

Figure 3:
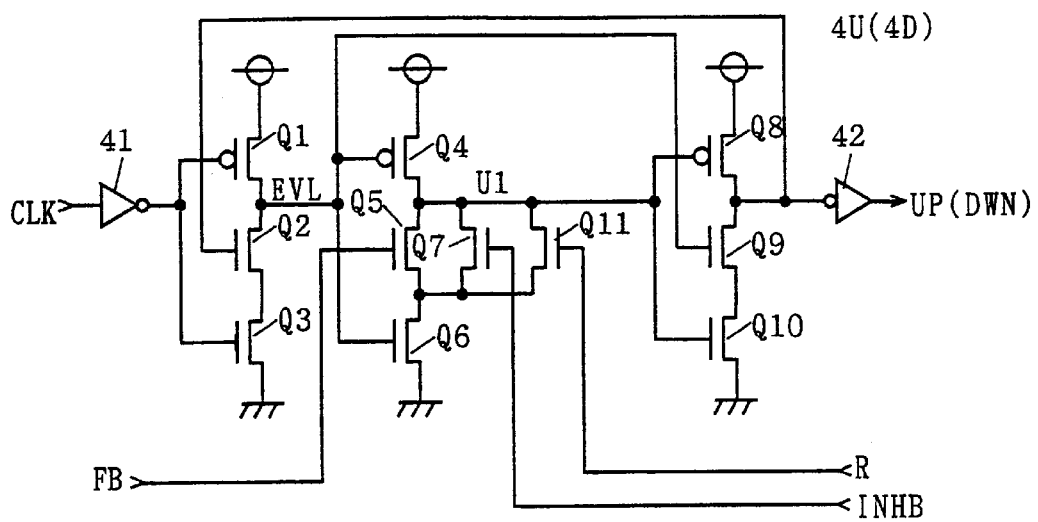
FIG. 3 is a circuit diagram showing the internal configuration of a phase comparison section shown in FIG. 2.
Figure 17:
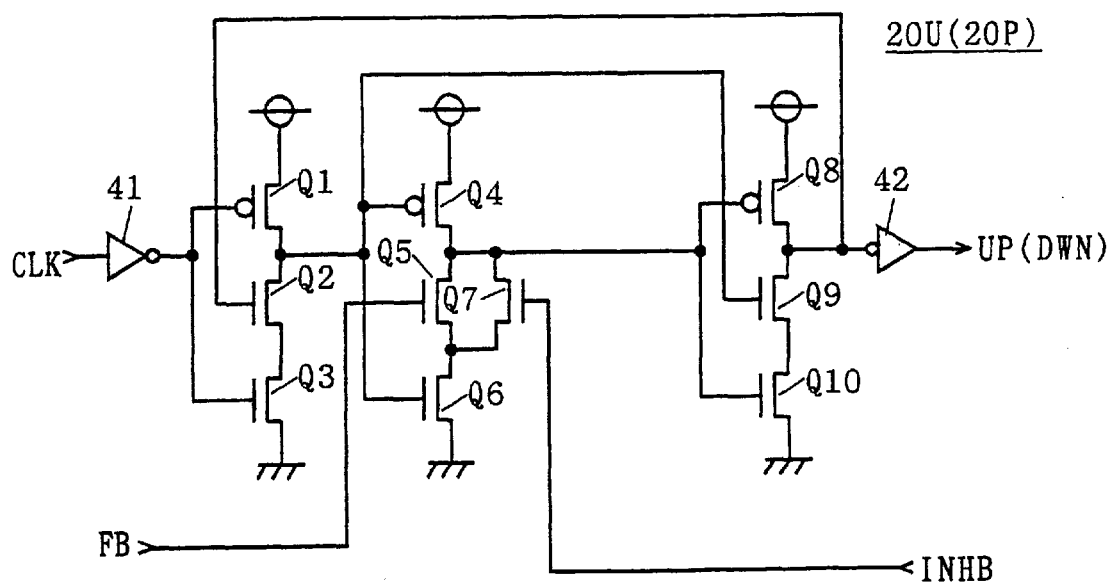
FIG. 17 is a circuit diagram showing the internal configuration of a phase comparison section shown in FIG. 16.
Figure 18:
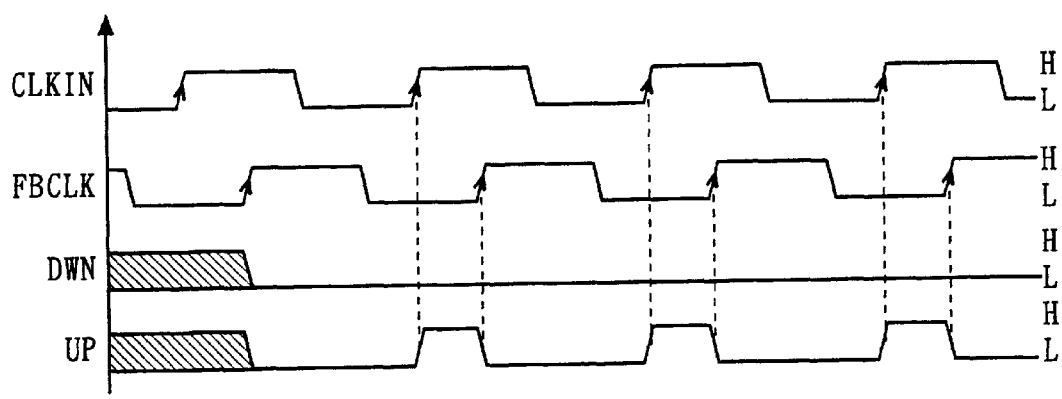
FIG. 18 is a timing diagram showing the operation of the phase comparator of FIG. 16.
Figure 19:
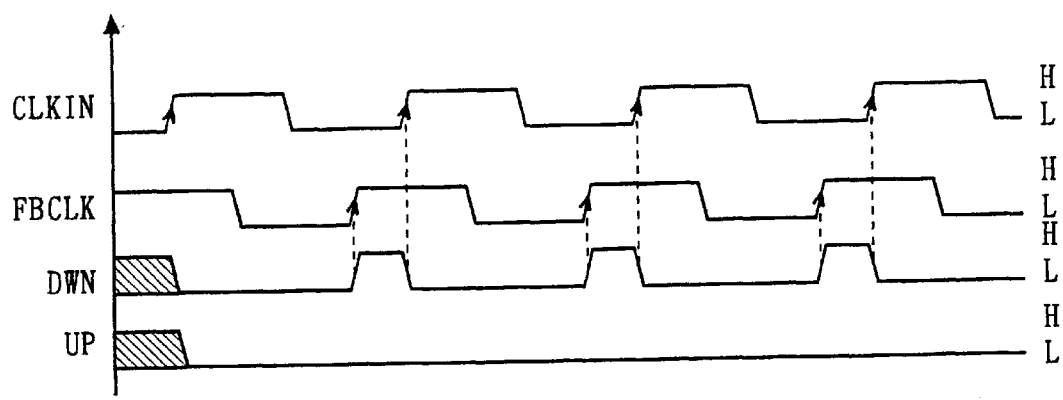
FIG. 19 is another timing diagram showing the operation of the phase comparator of FIG. 16.

FIG. 3 is a circuit diagram showing the internal configuration of a phase comparison section 4U (4D). This configuration differs from that of the conventional phase comparison section 20U (20D) shown in FIG. 17, in that NMOS transistor Q11 is connected in parallel to NMOS transistors Q5, Q7, and the gate of the NMOS transistor Q11 is connected to a reset input R.

Figure 4:
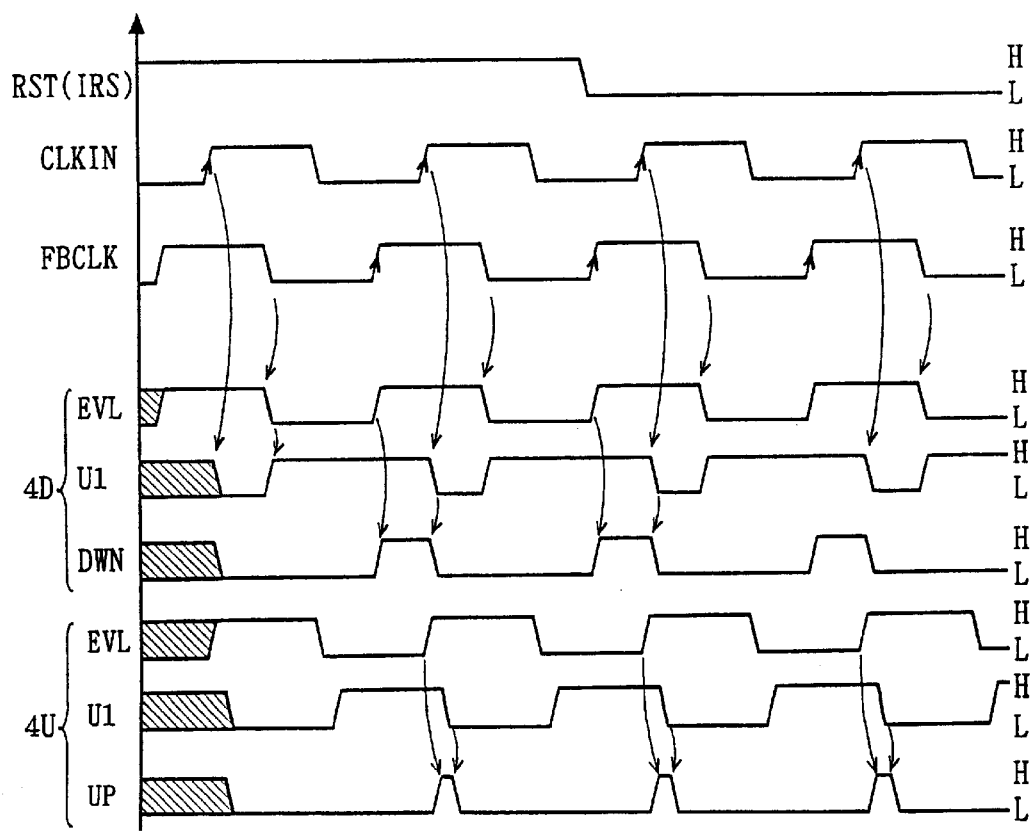
FIG. 4 is a timing diagram showing the operation of a phase comparator.
Figure 5:
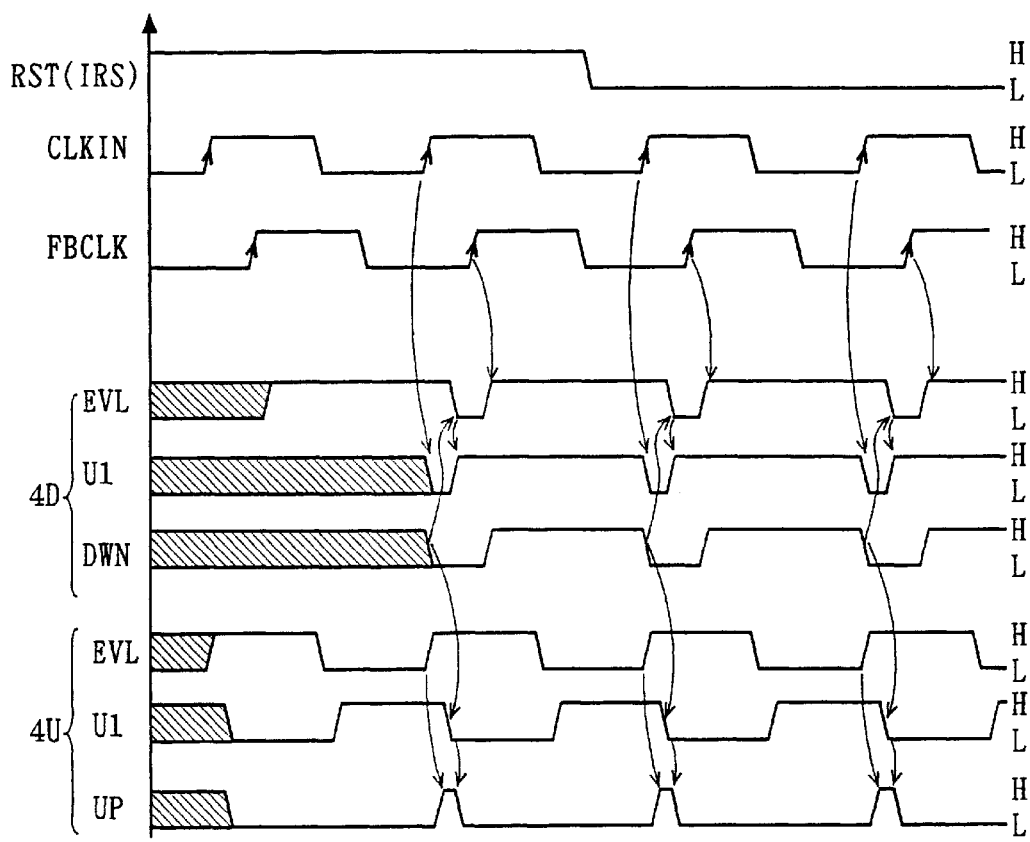
FIG. 5 is another timing diagram showing the operation of a phase comparator.

FIGS. 4 and 5 are a timing diagram showing a phase comparison operation of a phase comparator 3 as shown in FIGS. 2 and 3. That is, FIG. 4 shows the operation when the phase of a feedback signal FBCLK is advanced than that of an input signal CLKIN; and FIG. 5 shows the operation when the phase of a feedback signal FBCLK is delayed than that of an input signal CLKIN. In FIGS. 4 and 5, "EVL" stands for a drain potential of PMOS transistor Q1 of a phase comparison section 4U (4D), and "U1" stands for a drain potential of PMOS transistor Q4.

Hereinafter, the timing operation shown in FIG. 4 is described. For fixing to "L", a reset input R of a phase comparison section 4D outputs "H" as a down signal DWN, during a period equivalent to the period from the rise of a feedback signal FBCLK to the rise of an input signal CLKIN, regardless of "H" or "L" of an external reset signal RST.

Whereas in a phase comparison section 4U, NMOS transistor Q11 is in ON state during a reset period (i.e., while an external reset signal RST is "H"), leading to the same operation as that made when a signal of "H" is inputted to an inhibit input INHB, i.e., a potential U1 always becomes the reverse value of a potential EVL, so that a period of time an up signal UP becomes "H" is not practically present. Even after an external reset signal RST becomes "L" to release the reset, a down signal DWN of "H" is fed to the inhibit input INHB of the phase comparison section, so that a period of time an up signal UP becomes "H" is not practically present.

Next, the timing operation shown in FIG. 5 is described. During a reset period, a phase comparison section 4U does not practically output an up signal UP for becoming "H", as in the case of FIG. 4. Therefore, a phase comparison section 4D outputs a down signal DWN of "H" during a period equivalent to that from the rise of a feedback signal FBCLK to the rise of an input signal CLKIN, as in the case of FIG. 4.

After releasing the reset, the phase comparison section 4D outputs, as in the reset period, a down signal DWN of "H" during a period equivalent to that from the rise of a feedback signal FBCLK to the rise of an input signal CLKIN. On the other hand, a down signal of "H" is fed to the inhibit input INHB of the phase comparison section 4U, so that a period of time an up signal UP becomes "H" is not practically present.

For convenience of explanation for the operation of the phase comparator 3, a period of time an up signal UP becomes "H" is visible in FIGS. 4 and 5. However, there are practically no period of time an up signal UP becomes "H" because a potential U1 falls nearly concurrently with the rise of a potential EVL.

As described, whatever phase relations are present between an input signal CLKIN and a feedback input FB, after executing a rest operation, a down signal DWN of "H" is outputted during a period equivalent to that from the rise of a feedback signal FBCLK to the rise of an input signal CLKIN, and it is rarely that an up signal UP becomes "H".

Specifically, after executing a reset operation, the phase comparator 3 always outputs an up signal UP and a down signal DWN that cause the phase of a feedback signal FBCLK to delay. As a result, a delay time DT9 due to the delay line 9 is increased by the CP 6 and the LPF 28 that are connected to the subsequent stage of the phase comparator 3.

LPF (Low-Pass Filter) and Delay Line

Figure 6:
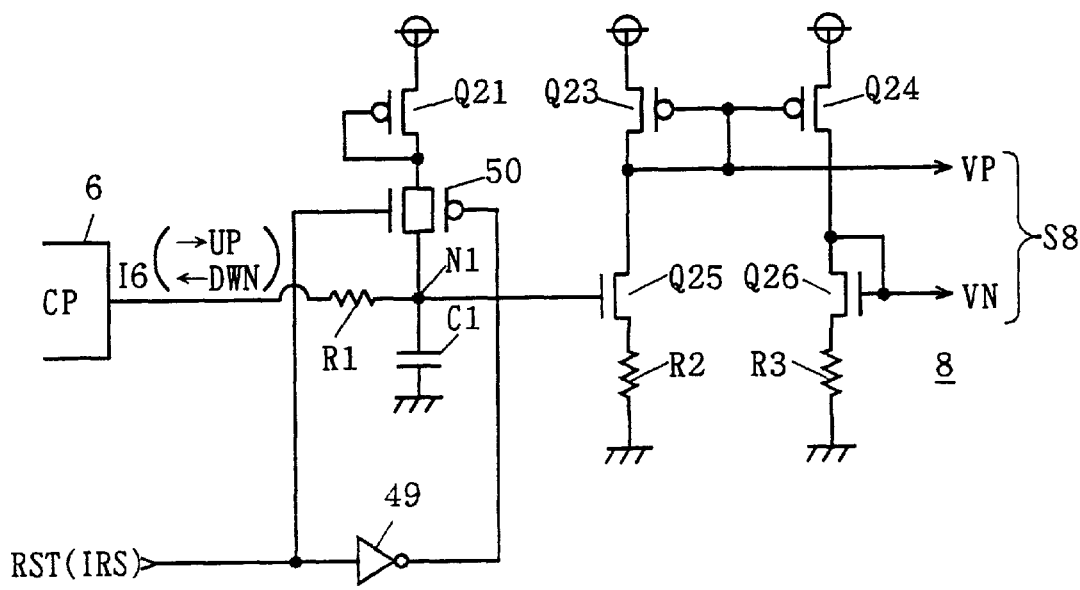
FIG. 6 is a circuit diagram showing the internal configuration of an LPF according to the first preferred embodiment.

FIG. 6 is a circuit diagram showing the internal configuration of an LPF 8. As shown in FIG. 6, an output section of a CP 6 for supplying/draining a current I6 is connected to a node N1 through a resistance R1. PMOS transistor Q21 and a transfer gate 50 are interposed from a power supply to the node N1. The gate of the PMOS transistor Q21 is connected to a drain, and NMOS gate of the transfer gate 50 receives an external reset signal RST, while PMOS gate of the transfer gate 50 receives the reverse signal of the external reset signal RST that is obtained through an inverter 49. A capacitor C1 is interposed between the node N1 and a ground level.

Between a power supply and a ground level, PMOS transistor Q23, NMOS transistor Q25 and a resistance R2 are interposed in series, and PMOS transistor Q24, NMOS transistor Q26 and a resistance R3 are also interposed in series.

The drain and gate of the PMOS transistor Q23 are connected in common, and the gates of the PMOS transistors Q23, Q24 are connected in common. The gate of the NMOS transistor Q25 is connected to the node N1, and the drain and gate of the NMOS transistor Q26 are connected in common.

An adjusting voltage VP obtained from the gate of the PMOS transistor Q23 and an adjusting voltage VN obtained from the gate of the NMOS transistor Q26 are outputted as a delay adjusting signal S8, to a delay line 9.

Figure 7:
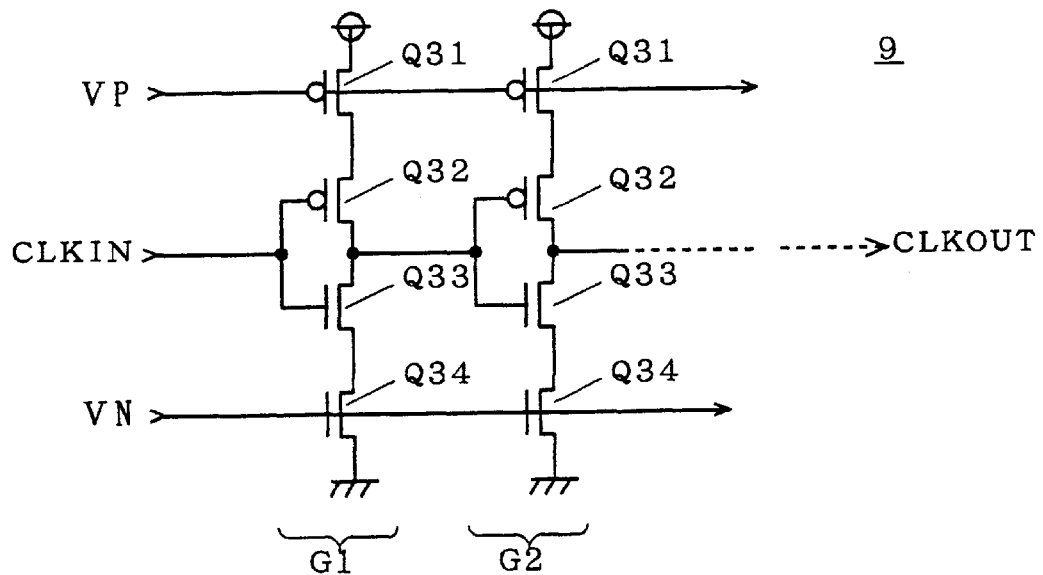
FIG. 7 is a circuit diagram showing the internal configuration of a delay line according to the first preferred embodiment.

FIG. 7 is a circuit diagram showing the internal configuration of a delay line 9. As shown in FIG. 7, a delay line 9 comprises a plurality of current-controlled type inverter sections G1, G2, which are connected in series. Each signal propagation delay time of the inverter sections G1, G2 is adjusted by adjusting voltages VP and VN, respectively.

The inverter sections G1, G2 comprise PMOS transistors Q31, Q32 and NMOS transistors Q33, Q34, which are connected in series between a power supply and a ground level.

In the inverter section G1, the gate of the PMOS transistor Q31 receives an adjusting voltage VP, the gates of the PMOS transistor Q32 and the NMOS transistor Q33 receive an input signal CLKIN in common, and the gate of the NMOS transistor Q34 receives an adjusting voltage VN.

In the inverter section G2, the gate of the PMOS transistor Q31 receives an adjusting voltage VP, the gates of the PMOS transistor Q32 and the NMOS transistor Q33 receive in common an output signal of the inverter section G1 (a signal obtained from the drain of the PMOS transistor Q32), and the gate of the NMOS transistor Q34 receives an adjusting voltage VN.

Similarly, in an inverter section of the subsequent stage of the inverter section G2, the gate of the PMOS transistor Q31 receives an adjusting voltage VP, the gates of the PMOS transistors Q32 and the NMOS transistor Q33 receive in common an output signal of the inverter section G1, and the gate of the NMOS transistor Q34 receives an adjusting voltage VN. An output of the inverter section of the final stage becomes a delay input signal CLKOUT.

Figure 8:
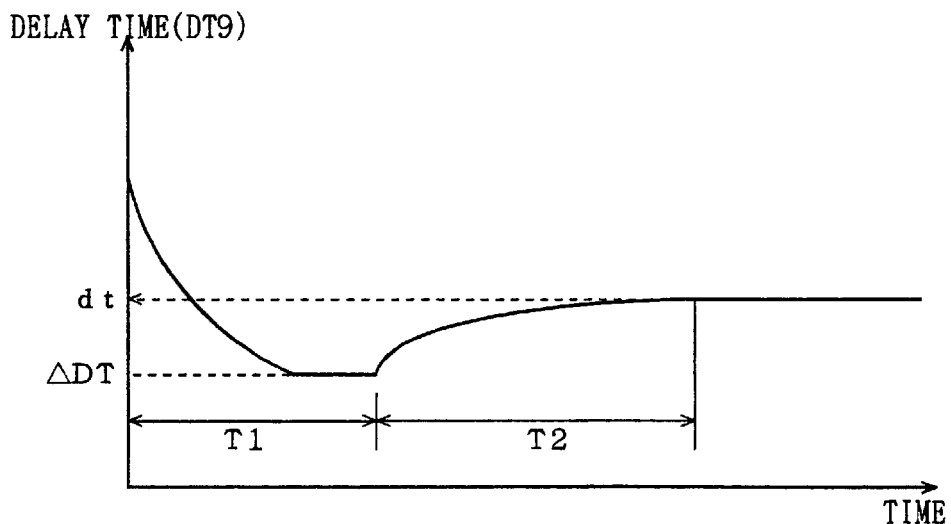
FIG. 8 is a graph showing a delay synchronization operation according to the first preferred embodiment.

The operation of an LPF 8 shown in FIG. 6 is described by referring to the graph of FIG. 8. When an external reset signal RST is "H", a transfer gate 50 is in ON state, and a potential V1 of a node N1 is charged up to a potential that is obtained by subtracting a threshold voltage $V_{THP}$ of PMOS transistor Q21 from a power supply voltage $V_{DD}$ (i.e., $V_{DD}-V_{THP}$). This strongly changes NMOS transistor Q25 into ON state, so that the adjusting voltage VP obtained from the gate of PMOS transistor Q23 drops to the lowest level, whereas an adjusting voltage VN obtained from the gate of NMOS transistor Q26 rises to the highest level.

As a result, the PMOS transistor Q31 and the NMOS transistor Q34 in the respective inverter sections of the delay line 9 shown in FIG. 7, are the most strongly turned into ON state to operate with the maximum driving force. Therefore, as shown in FIG. 8, the delay time DT9 due to the delay line 9 becomes a minimum delay time ΔDT during a rest period T1.

After releasing the reset, the transfer gate 50 of the LPF 8 is in ON state, and a phase comparator 3 outputs an up signal UP and a down signal DWN that cause the phase of a feedback signal FBCLK to delay, so that a CP 6 operates in such a direction as to drain a current I6 from the node N1.

Consequently, in a delay adjusting signal S8 an adjusting voltage VP increases whereas an adjusting voltage VN decreases. Then, as shown in FIG. 8, the delay time DT9 of the delay line 9 increases gradually and then stabilizes at dt after a passage of a locking period T2 from the reset release. That is, when the delay time DT9 of the delay line 9 is dt, an input signal CLKIN is in synchronization with a feedback signal FBCLK.

Thus, in the DLL circuit 11 of the first preferred embodiment, since a delay synchronization operation executed after a reset operation is started after a delay time DT9 of the delay line 9 is initialized to a minimum delay time ΔDT, it is possible to perform a delay synchronization processing in a state where current-controlled type inverters G1, G2 constituting the delay line 9 have a large driving force. This enables to minimize the influence of jitter that is caused by a waveform rounding of a signal propagating the delay line 9.

Second Preferred Embodiment
Entire Configuration

Figure 9:
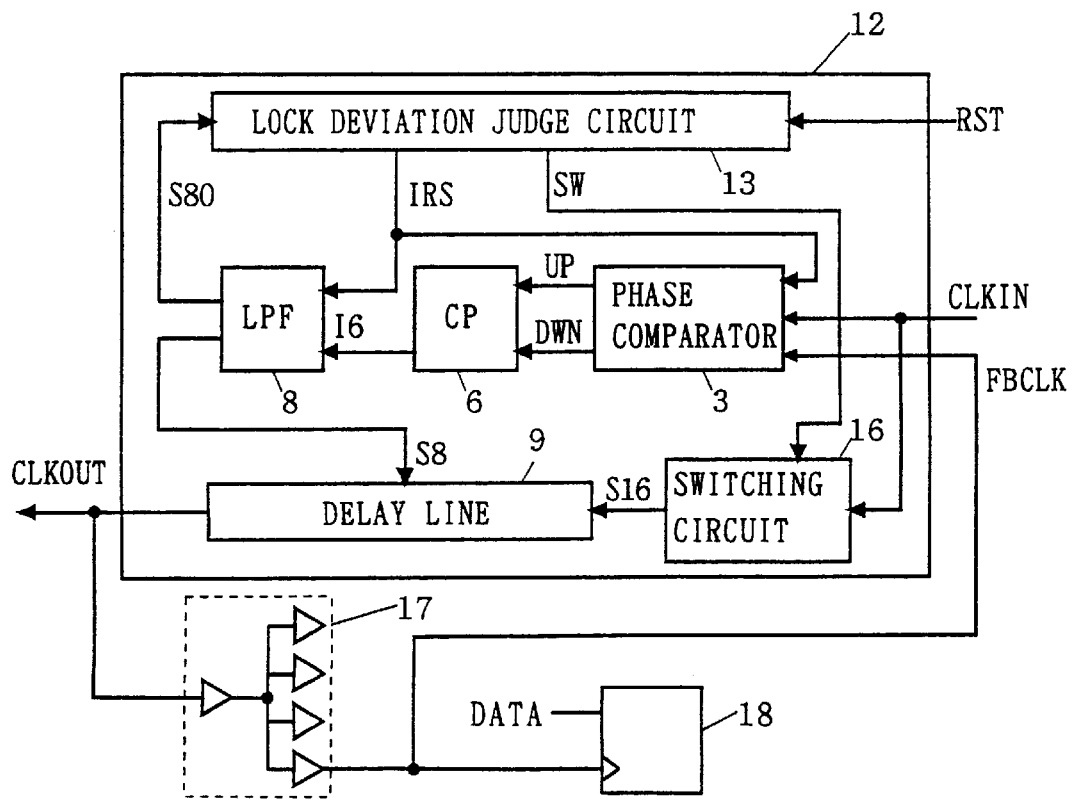
FIG. 9 is a diagram for explaining the configuration of a DLL circuit according to a second preferred embodiment of the present invention.

FIG. 9 is a diagram for explaining the configuration of a DLL circuit 12 according to a second preferred embodiment of the present invention. As shown in FIG. 9, a phase comparator 3 performs the normal comparison operation/comparison operation during reset, based on "L"/"H" of an internal reset signal IRS. The phase comparator 3 always delays a phase at the time of comparison operation during reset, that is, outputs a phase comparison result that causes a delay time of a delay line 9 to increase.

An LPF 8 integrates a current I6 and, based on its result, outputs a delay adjusting signal S8 to the delay line 9. The LPF 8 outputs a delay adjusting signal S8 for minimizing a delay time due to the delay line 9, regardless of a current I6 of a CP 6.

A lock deviation judge circuit 13 receives a charge/discharge condition detecting signal S80 and an external reset signal RST to output an internal reset signal IRS and a switching signal SW. The lock deviation judge circuit 13 detects whether a synchronization deviation phenomenon is present or not based on a charge/discharge condition detecting signal S80 of the LPF 8. When the judge circuit 13 detects a synchronization deviation phenomenon, it sets an internal reset signal IRS to "H" and also inverts a switching signal SW.

The lock deviation judge circuit 13 sets an internal reset signal IRS to "L" and retains a switching signal SW as it is, when no synchronization deviation phenomenon is detected. The judge circuit 13 forcedly sets an internal reset signal IRS to "H" when an external reset signal RST is "H".

The DLL circuit 12 has the same configuration and connection relations as the DLL circuit 11 of the first preferred embodiment, except that a switching circuit 16 feeds a delay line 9 with an output signal S16 that is obtained by inverting/not inverting an input signal CLKIN based on "H"/"L" of a switching signal SW.

A phase comparator 3 has the same configuration as the phase comparator 3 shown in FIGS. 2 and 3 of the first preferred embodiment, except that an internal reset signal IRS is inputted in place of an external reset signal RST.

An LPF 8 has the same configuration as the LPF 8 shown in FIG. 6 of the first preferred embodiment, except that an internal reset signal IRS is inputted in place of an external reset signal RST. It is noted that a potential V1 of the node N1 shown in FIG. 6 is supplied to a lock deviation judge circuit 13, as a charge/discharge condition detecting signal S80.

A delay line 9 has the same internal configuration as the delay line 9 shown in FIG. 7 of the first preferred embodiment.

The DLL circuit 12 of the second preferred embodiment comprises the phase comparator 3, the CP 6, the LPF 8, the switching circuit 16 and the delay line 9, and operates to match the phases of an input signal CLKIN and a feedback signal FBCLK, as in prior art.

However, when an internal reset signal IRS is "H" (i.e., when an external reset signal RST is "H", or when a lock deviation judge circuit 13 detects a synchronization deviation), the phase comparator 3 always outputs an up signal UP and a down signal DWN that cause a phase to delay, and the LPF 8 outputs to the delay line 9 a delay adjusting signal S8 indicating a minimum delay time ΔDT.

In the DLL circuit 12, an internal reset signal IRS becomes "H" by setting an external reset signal RST to "H" for a predetermined period and then to "L", at the time of initial operation. Therefore, the DLL circuit 12 always performs a delay synchronization operation in such a direction as to increase a delay time DT9 of the delay line 9 after initializing the delay time DT9 to a minimum delay time ΔDT.

Accordingly, in the DLL circuit 12 by setting a variable delay time range of the delay line 9 without taking into consideration a direction to decrease a delay time DT9, it is possible to set a narrow variable delay time range of the delay line 9 and thus to minimize circuit configuration and dissipation power, as in the first preferred embodiment.

Lock Deviation Judge Circuit

Figure 10:
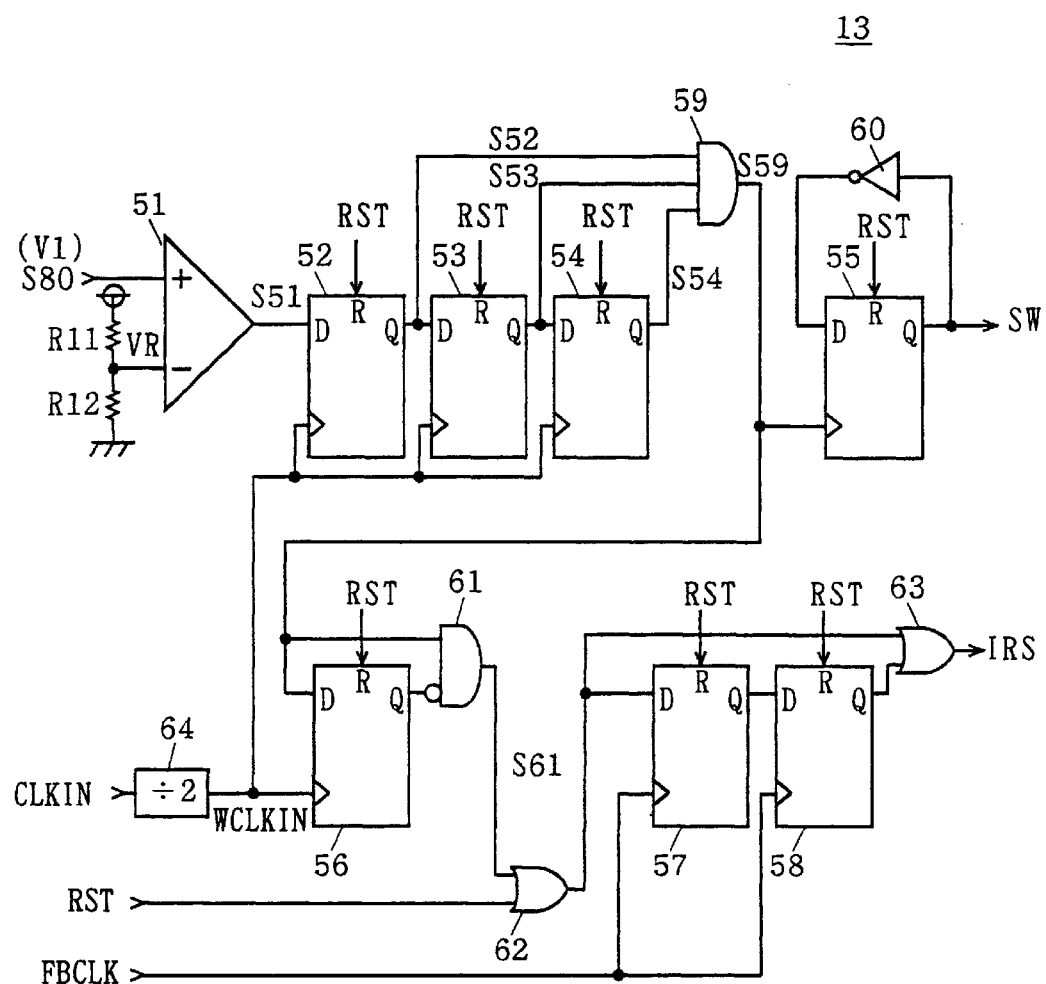
FIG. 10 is a circuit diagram showing the internal configuration of a lock deviation judge circuit according to the second preferred embodiment.

FIG. 10 is a circuit diagram showing the internal configuration of a lock deviation judge circuit 13. As shown in FIG. 10, in a comparator 51 a positive input receives a charge/discharge condition detecting signal S80 (a potential V1 of a node N1 in an LPF 8) and a negative input receives a reference voltage VR, to output a comparison result signal S51. Resistances R11, R12 are connected in series between a power supply voltage $V_{DD}$ and a ground level. The voltages of the resistances R11, R12 that are obtained by dividing the resistance by the resistances R11, R12, become a reference voltage VR.

A reference voltage VR is set to be higher than a potential V1 of a node N1 during normal condition and lower than a potential V1 of the node N1 in an excessive supply of a current I6 from a CP 6. For instance, it is set to VR=($V_{DD}$-$V_{THP}$)+α(>0), taking into consideration ($V_{DD}$-$V_{THP}$), which is a potential V1 of the node N1 in the LPF 8 at the time of reset.

D flip-flops 52 to 54 are connected in series. In the D flip-flop 52, D input receives a comparison result signal S51. Q output signals S52 to S54 of the D flip-flops 52 to 54 are inputted to AND gate 59. An output signal of the AND gate 59 becomes a decision signal S59. That is, the fact that a decision signal S59 is "H" means that a lock deviation is detected.

In D flip-flop 55, a clock input receives a decision signal S59, and Q output is returned to D input through an inverter 60. Q output signal of the D flip-flop 55 becomes a switching signal SW.

A frequency divider 64 receives an input signal CLKIN and divides the frequency of the input signal CLKIN into ½, to output a divided frequency input signal WCLKIN.

In D flip-flop 56 a clock input receives a divided input signal WCLKIN and D input receives a decision signal S59. In AND gate 61 a first input receives a decision signal S59 and a second input receives the reverse signal of Q output of the D flip-flop 56. In OR gate 62 a first input receives an output signal S61 of the AND gate 61 and a second input receives an external reset signal RST.

D flip-flops 57, 58, whose clock input receives a feedback signal FBCLK in common, are connected in series. D input of the D flip-flop 57 receives an output signal of the OR gate 62. An external reset signal RST is fed in common to each reset input R of the D flip-flops 52 to 58.

In OR gate 63 a first input receives an output signal of the OR gate 62 and a second input receives Q output signal of the D flip-flop 58. An output signal of the OR gate 63 becomes an internal reset signal IRS.

Figure 11:
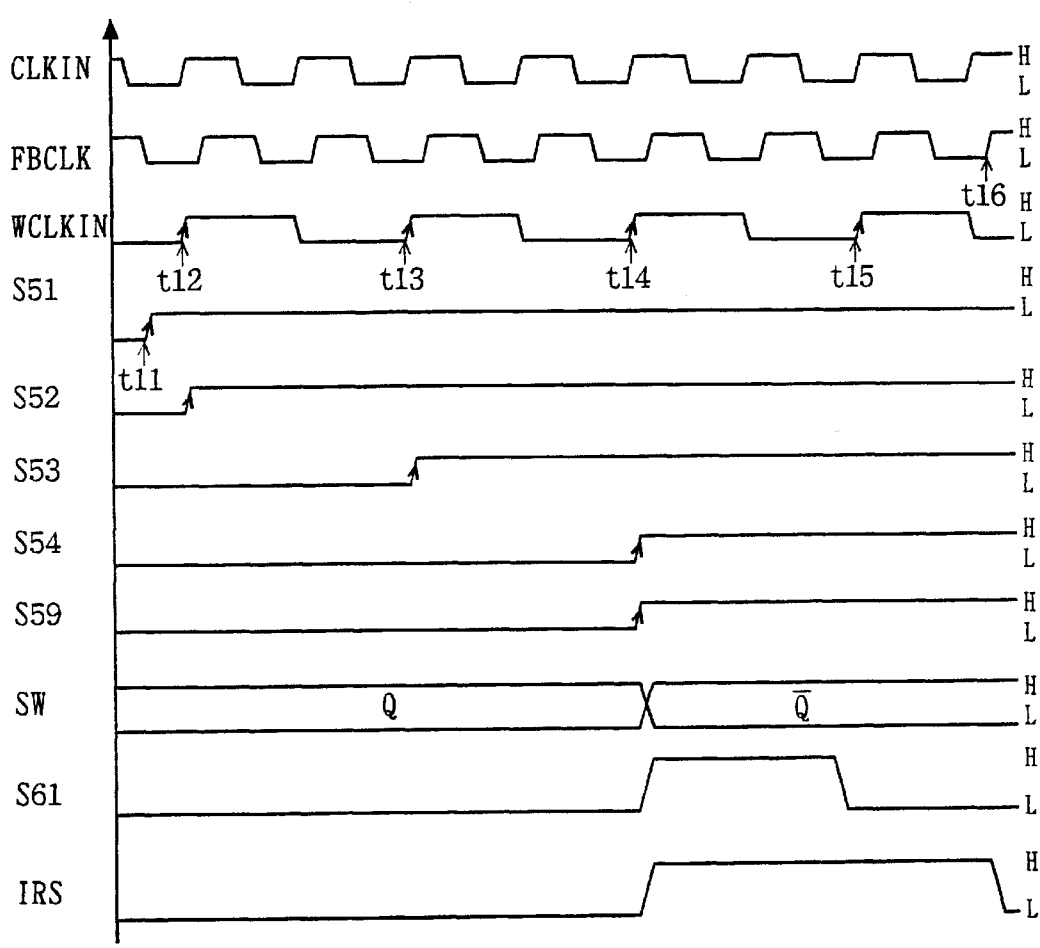
FIG. 11 is a timing diagram showing the operation of a lock deviation judge circuit.

FIG. 11 is a timing diagram showing a lock deviation detection operation by the lock deviation judge circuit 13 shown in FIG. 10. The operation of the lock deviation judge circuit 13 at the time of non-reset (i.e., when an external reset signal RST is "L") is described by referring to FIG. 11.

Figure 20:
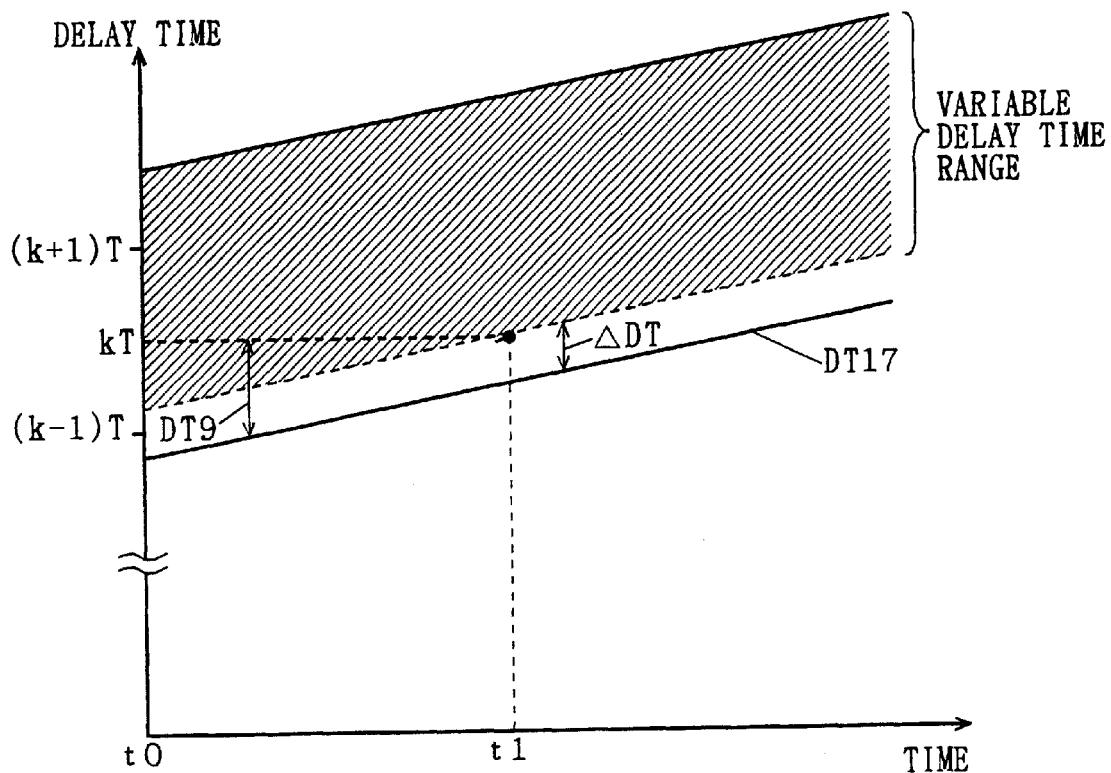
FIG. 20 is a graph for explaining a lock deviation phenomenon.

Even if a phase comparator 3 continues to output an up signal UP and a down signal DWN that cause the phase of a feedback signal FBCLK to advance, when a delay time DT9 of a delay line 9 already reaches a minimum delay time ΔDT, the feedback signal FBCLK cannot be in synchronization wit CLKIN (see time t1 and afterward in FIG. 20).

In this case, a CP 6 excessively supplies a current I6 to an LPF 8. As a result, a potential V1 of a node N1 increases and, when it exceeds a reference voltage VR at time t11, a comparison result signal S51 of a comparator 51 changes from "L" to "H".

Thereafter, the phase comparator 3 continues to cause the phase of the feedback signal FBCLK to advance, so that the CP 6 continues to supply a current I6. Since the state of V1>VR is retained, D flip-flops 52, 53 and 54 sequentially latch "H" at time t12, t13 and t14, respectively, at which a divided input signal WCLKIN rises to "H" after time t11.

Then, at time t14, all Q output signals S52 to S54 become "H" and a decision signal S59 being output of the AND gate 59 changes from "L" to "H", so that the value of a switching signal SW being Q output of the D flip-flop 55 is reversed.

At the same time, since an output signal S61 of the AND gate 61 changes from "L" to "H", an interior reset signal IRS also changes from "L" to "H", resulting in an internal reset state.

At time t15 that a divided input signal WCLKIN rises to "H" again, the D flip-flop 56 latches a decision signal S59 of "H" to change the second input of the AND gate 61 from "H" to "L". Therefore, the output signal S61 changes from "H" to "L".

Since an output signal S61 of "L" is fed to D input of the D flip-flop 57 through the OR gate 62, "L" is latched by the D flip-flop 58 at time t16 that is the second rising of the feedback signal FBCLK since time t15. Therefore, an internal reset signal IRS being output signal of the OR gate 63 falls to "L".

As described, the lock deviation judge circuit 13 changes the decision signal S59 into "H" to decide that a lock deviation is present, when an excess current supply of a current I6 from a CP 6 continues more than a predetermined period (at least two periods of a divided input signal WCLKIN, i.e., more than four periods of an input signal CLKIN).

Then, the lock deviation judge circuit 13 inverts a switching signal SW by a decision signal S59 of "H" and also sets an internal reset signal IRS to "H" to have an internal reset state. It is noted that at the time of external reset (when an external reset signal RST is "H"), an internal reset signal IRS becomes "H" by OR gates 62, 63, regardless of "H" or "L" of the decision signal S59.

Thus, in the DLL circuit 12 an internal reset signal IRS becomes "H" for a predetermined time when a lock deviation is preset. Therefore, after a delay time DT9 of the delay line 9 is initialized to a minimum delay time ΔDT, the DLL circuit 12 always performs a delay synchronization operation in such a direction as to increase the delay time DT9.

Switching Circuit

Figure 12:
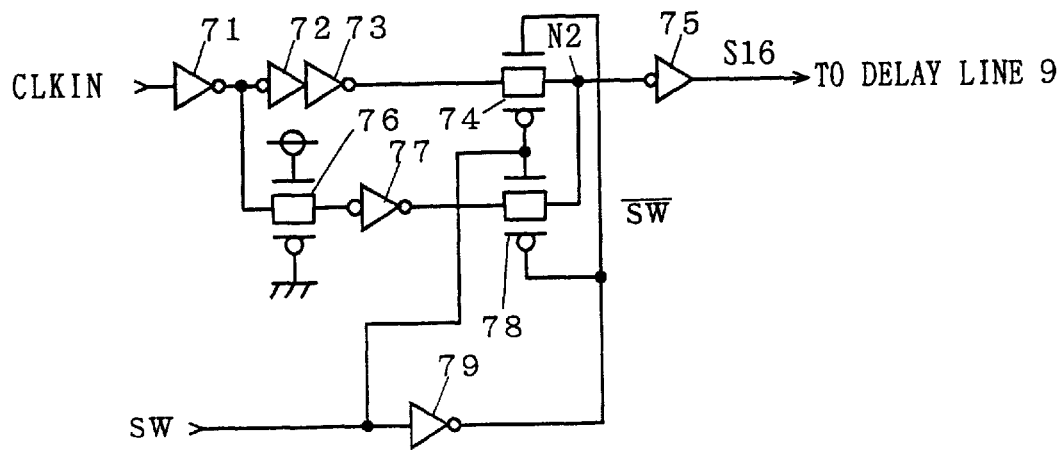
FIG. 12 is a circuit diagram showing the internal configuration of a switching circuit.

FIG. 12 is a circuit diagram showing the internal configuration of a switching circuit 16. As shown in FIG. 12, inverters 71 to 73 are connected in series, an input of the inverter 71 receives an input signal CLKIN, and an output of the inverter 73 is connected to a node N2 through a transfer gate 74.

An output of the inverter 71 is also connected to an input of an inverter 77 through a transfer gate 76, and the output of the inverter 77 is connected to the node N2 through a transfer gate 78.

A switching signal SW is fed to PMOS gate of the transfer gate 74 and NMOS gate of the transfer gate 78. The reverse signal $\overline{sw}$ of a switching signal SW is fed to NMOS gate of the transfer gate 74 and PMOS gate of the transfer gate 78. NMOS gate of the transfer gate 76 is connected to a power supply while PMOS gate is grounded, thereby setting to ON state all the times.

The node N2 is connected to an input of the inverter 75, and an output signal of the inverter 75 is fed to a delay line 9, as a signal S16. The transfer gate 76 is set to a delay time of signal propagation per inverter.

In this switching circuit 16, when a switching signal SW is "H", the transfer gate 74 is in OF state while the transfer gate 78 is in ON state. Therefore, when the reverse signal of an input signal CLKIN is outputted from the inverter 75 and a switching signal SW is "L", the transfer gates 74 and 75 are in ON state and OFF state, respectively, so that the non-reversed signal of an input signal CLKIN is outputted from the inverter 75.

Figure 13:
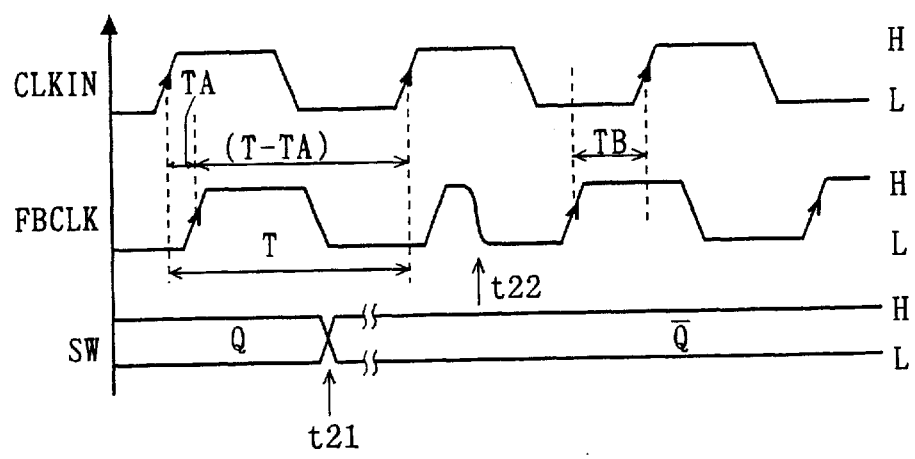
FIG. 13 is a timing diagram showing the operation of a switching circuit.

FIG. 13 is a timing diagram showing the operation of a switching circuit 16. In FIG. 13, at time t21 the value of a switching signal SW is reversed from Q to $\overline{Q}$, which then triggers the reversal of an output signal S16. Accordingly, the phase of a feedback signal FBCLK is reversed after time t22 that the reversed output signal S16 passes through a delay line 9 and an internal circuit 17.

Then, the phase of the feedback signal FBCLK that has been delayed time TA than an input signal CLKIN, is conversely advanced time TB (=T/2−TA). Here, a lock point is always within T/2.

Therefore, after an internal reset signal IRS is set to "H" and a delay time DT9 of the delay line 9 is initialized to a minimum delay time ΔDT, by performing a delay synchronization operation in such a direction as to increase the delay time DT9, it is possible to promptly synchronize an input signal CLKIN with a feedback signal FBCLK.

Although a "spike" occurs temporarily in a feedback signal FBCLK as shown in FIG. 13, thanks to the D flip flops 57, 58, an internal reset signal IRS can retain "H" during two cycle periods of the feedback signal FBCLK, causing no influence.

Thus, in the lock deviation judge circuit 13 and the switching circuit 16 on the DLL circuit 12 of the second preferred embodiment, the phase difference between an input signal CLKIN and a feedback signal FBCLK can be reversed within T/2 by inverting the phase of the feedback signal FBCLK when a lock deviation phenomenon occurs. This permits a prompt re-locking even when a lock deviation phenomenon occurs due to temperature charge or the like.

D Flip-Flop

Figure 14:
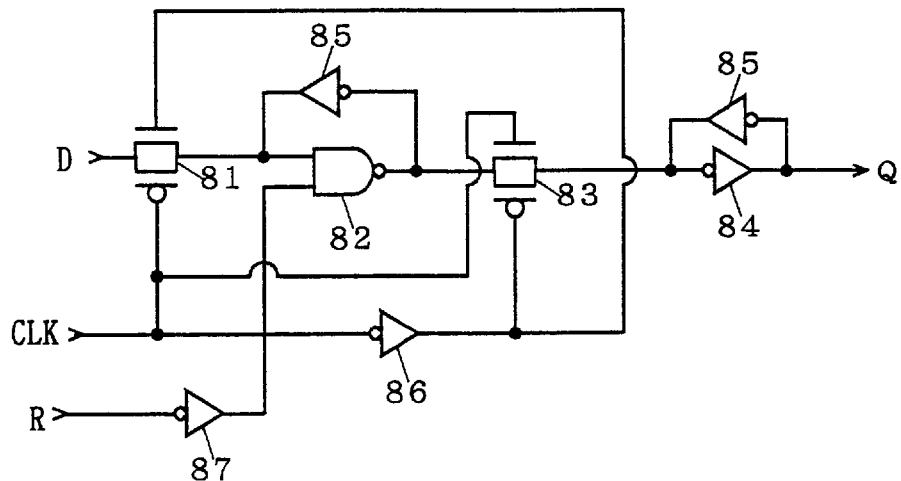
FIG. 14 is a circuit diagram showing the internal configuration of D flip-flop shown in FIG. 10.
Figure 15:
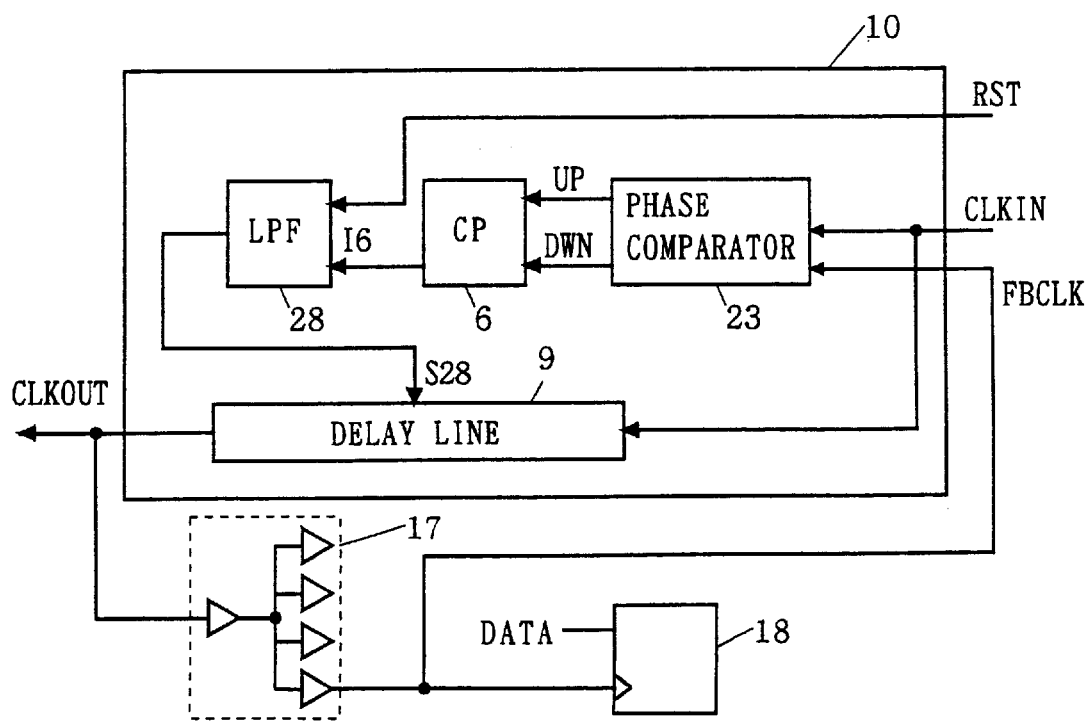
FIG. 15 is a diagram for explaining the configuration of a conventional DLL circuit.
Figure 16:
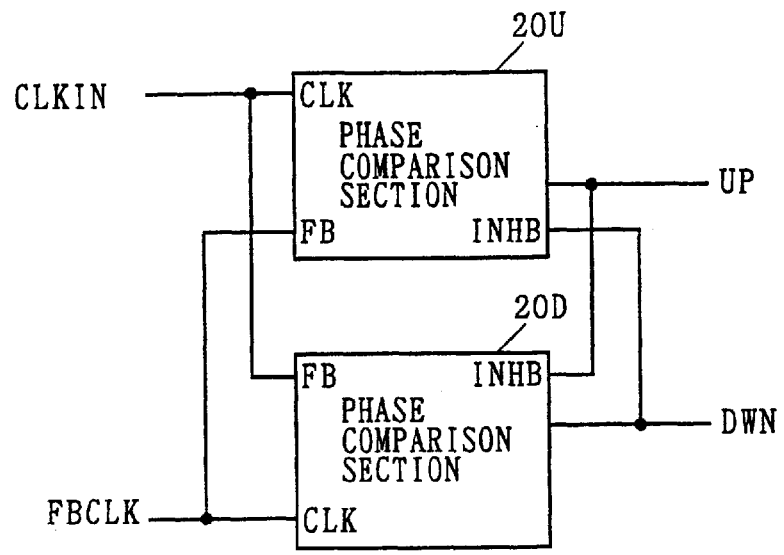
FIG. 16 is a circuit diagram showing the configuration of a phase comparator shown in FIG. 15.

FIG. 14 is a circuit diagram showing the internal configuration of D flip-flops 52 to 58. In FIG. 14, D input is connected to a first input of NAND gate 82 through a transfer gate 81. In the NAND gate 82 a second input receives an output of an inverter 87, and an output is returned to a first input through an inverter 85. An input of the inverter 87 is connected to a reset input R.

An output of the NAND gate 82 is connected to an input of an inverter 84 through a transfer gate 83. An output of the inverter 84 is outputted to the exterior, as Q output, and then returned to an input through the inverter 85. PMOS gate of the transfer gate 81 and NMOS gate of the transfer gate 83 are connected to a clock input CLK, and NMOS gate of the transfer gate 81 and PMOS gate of the transfer gate 83 are connected to a clock input CLK through an inverter 86.

In the D flip-flops as described, since in the normal condition (when a reset input R is "L") the transfer gates 81 and 82 are in ON state and OFF state, respectively, when a clock input CLK is "L". Therefore, the reverse value of D input is latched by a first latch comprised of the loop connection of the NAND gates 82, 85. On the other hand, the transfer gates 81 and 82 are in OF state and ON state, respectively, when a clock input CLK is "H", so that the reverse value of the first latch is transferred to a second latch comprised of the loop connection of the inverters 84, 85.

Specifically, during normal condition, the D flip-flops latch the signal that is obtained from D input when a clock input CLK rises to "H". At the time of reset (when a reset input R is "H"), "H" is latched by the first latch irrespective of D input, and "L" is latched by the second latch when a clock input CLK is "H". Others In the first and second preferred embodiments, when executing an external or internal reset, a delay time DT9 of the delay line 9 is initialized to a minimum delay time ΔDT, and then a delay synchronization operation is always performed in such a direction as to increase the delay time DT9. In contrast, it is possible that a delay time DT9 of the delay line 9 is initialized to a maximum delay time, and then a delay synchronization operation is always performed in such a direction as to decrease the delay time DT9.

In such a case, however, the waveform of a delay input signal CLKOUT outputted from the delay line 9 is liable to round because the driving force of the inverter section constituting the delay line 9 drops to the lowest level at initialization.

In the second preferred embodiment, even if omitted a switching signal generating section of the switching circuit 16 and the lock deviation judge circuit 13 (i.e., the D flip-flop 55 and inverter 60), a delay synchronization can be resumed when a lock deviation is present, if the delay line 9 has a variable delay time range of one period of an input signal CLKIN.

That is, the phenomenon that the phase of a feedback signal FBCLK is delayed TA with respect to an input signal CLKIN, as shown in FIG. 13, can be regarded that the phase of the feedback signal FBCLK is advanced (T-TA). Thus, when the lock deviation judge circuit 13 detects a lock deviation phenomenon, an internal signal reset signal IRS changes to "H", so that the DLL circuit 12 executes a delay synchronization operation in such a direction as to increase a delay time DT9, thereby synchronizing the input signal CLKIN with the feedback signal FBCLK.

Although the lock deviation judge circuit 13 judges the presence of a lock deviation phenomenon by using a potential V1 of the node N1 in the LPF 8 as a monitor signal, it is able to use any kind of signal capable of detecting whether the phase comparator 3 indicates an excessive phase advance.

In addition, the lock deviation judge circuit 13 may judge the presence of a lock deviation phenomenon by detecting whether the phase comparator 3 indicates an excessive phase delay.

While the invention has been shown and described in detail, the foregoing description is in all aspects illustrative and not restrictive. It is therefore understood that numerous modifications and variations can be devised without departing from the scope of the invention.

We claim:

1. A delay locked loop circuit for synchronizing phases of a reference clock signal and a real use clock signal, comprising:

phase comparator for comparing phases of said reference clock signal and said real use clock signal;

delay time control portion for outputting a delay control signal based on a phase comparison result of said phase comparator; and delay line having a variable delay time range from a first limiting delay time to a second limiting delay time, for causing said reference clock signal to delay a delay time indicated by said delay control signal, to output a delay reference clock signal, a signal obtained after said delay reference clock signal propagates a circuit outside said delay locked loop circuit being used as said real use clock signal, wherein said delay time control portion receives a reset signal and outputs said delay time control signal indicating said first limiting delay time when said reset signal is active; and wherein said phase comparator receives said reset signal and outputs said phase comparison result that forcedly indicates a delay time shift in a first direction from said first limiting delay time to said second limiting delay time, during a synchronization processing period which includes a period from a time when said reset signal changes from active to inactive to a time when said reference clock signal is in synchronization with said real use clock signal.

2. The delay locked loop circuit of claim 1, wherein said phase comparison result of said phase comparator includes a first comparison result that indicates presence/absence of a delay time shift of said first direction by active/inactive state, and a second comparison result that indicates presence/absence of a delay time shift in a second direction opposite to said first direction by active/inactive state; and said phase comparator includes:
  a first phase comparison section for outputting said first comparison result based on a phase difference between said reference clock signal and said real use clock signal, said first phase comparison section receiving said second comparison result and, when it is active, forcedly changing said first comparison result to inactive state; and
  a second phase comparison section for outputting said second comparison result based on a phase difference between said reference clock signal and said real use clock signal, said second phase comparison section receiving said first comparison result and, when it is active, forcedly changing said second comparison result to inactive state,
  wherein said second phase comparison section further receives said reset signal and, when it is active, forcedly changing said second comparison result to inactive state.

3. The delay locked loop circuit as defined in claim 1, wherein said reset signal contains an external reset signal that can be inputted from exterior.

4. The delay locked loop circuit of claim 1, wherein said delay time control portion includes:
  a charge pump having an output section, for supplying a current from said output section, alternatively, drains a current into said output section, based on an indication of said phase comparison result; and
  a low-pass filter having a predetermined node connected to said output section of said charge pump, for outputting said delay time control signal based on a potential of said predetermined node obtained by low-pass filtering,
  said low-pass filter forcedly sets a potential of said predetermined node to a reset potential when said reset signal is active, and
  said delay time control signal indicates said first limiting delay time when a potential of said predetermined node is said reset potential.

5. The delay locked loop circuit of claim 4, wherein said delay time control signal contains a control voltage,
said delay line includes a plurality of delay sections connected in series, said plurality of delay sections receiving said control voltage in common so that each signal propagation delay time is determined based on said control voltage, and
said delay time control portion outputs said control voltage so that a total signal propagation delay time of said plurality of delay sections equals to said first limiting delay time, when said reset signal is active.

6. The delay locked loop circuit of claim 1, wherein said reset signal contains an internal reset signal that is generated inside,
said delay locked loop circuit further comprising:
  a synchronization deviation judge circuit for monitoring a signal related to said phase comparison result to judge a presence of a synchronization deviation based on an extent to which said phase comparison result indicates a delay time shift in a predetermined direction, and then outputting said internal reset signal based on a result of judge, said synchronization deviation judge circuit changing said internal reset signal to active state for a predetermined period and then to inactive state, if judged said synchronization deviation is present.

7. The delay locked loop circuit of claim 6, wherein said delay time control portion includes:
  a charge pump for supplying a current from an output section, alternatively, drains a current into said output section, based on an indication of said phase comparison result; and
  a low-pass filter having a predetermined node connected to said output section of said charge pump, for outputting said delay time control signal based on a potential of said predetermined node obtained by low-pass filtering,
  said signal related to said phase comparison result contains a potential of said predetermined node.

8. The delay locked loop circuit of claim 6, wherein said predetermined direction contains a second direction opposite to said first direction; and
said synchronization deviation judge circuit further outputs a judge related signal based on said presence/absence of said synchronization deviation,
said delay locked loop circuit further comprising:
  a phase inversion portion for receiving said judge related signal to recognize a synchronization deviation time when it is judged said synchronization deviation is present, and then performing an inversion operation for inverting a phase of said delay reference clock signal by using said synchronization deviation time as a trigger.

9. The delay locked loop circuit of claim 8, wherein said judge related signal contains a switching signal that alternates between a first state and a second state each time said synchronization deviation is present; and
said phase inversion means receives said reference clock signal and said switching signal to feed said reference clock signal intactly to said delay line when said switching signal is in said first state, and to invert said reference clock signal to feed it to said delay line when said switching signal is in said second state.

10. The delay locked loop circuit of claim 6, wherein said synchronization deviation means further receives an external reset signal that can be inputted from exterior to forcedly change said internal reset signal to active state when said external reset signal is active.

11. The delay locked loop circuit of claims 6, wherein said first limiting delay time contains a minimum delay time within said variable delay time range, said second limiting delay time contains a maximum delay time within said variable delay time range, and said first direction contains a direction to increase a delay time.

12. The delay locked loop circuit of claim 1, wherein said first limiting delay time contains a minimum delay time within said variable delay time range, said second limiting delay time contains a maximum delay time within said variable delay time range, and said first direction contains a direction to increase a delay time.

13. A delay locked loop circuit for synchronizing phases of a reference clock signal and a real use clock signal, comprising:

phase comparator for comparing phases of said reference clock signal and said real use clock signal;

delay time control portion for outputting a delay control signal based on a phase comparison result of said phase comparator;

delay line for causing said reference clock signal to delay a delay time indicated by said delay control signal to output a delay reference clock signal, a signal that is obtained after said delay reference clock signal propagates a circuit outside said delay locked loop circuit being used as said real use clock signal;

synchronization deviation judge circuit for monitoring a signal related to said phase comparison result to judge a presence of a synchronization deviation based on an extent to which said phase comparison result indicates a delay time shift in a predetermined direction.

* * * * *